(12) United States Patent
Tangudu et al.

(10) Patent No.: US 10,666,293 B2
(45) Date of Patent: *May 26, 2020

(54) DIGITAL DOWN CONVERTER

(71) Applicant: TEXAS INSTRUMENTS INCORPORATED, Dallas, TX (US)

(72) Inventors: Jawaharlal Tangudu, Bangalore (IN); Suvam Nandi, Bangalore (IN); Jaiganesh Balakrishnan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/960,591

(22) Filed: Apr. 24, 2018

(65) Prior Publication Data

US 2018/0241413 A1 Aug. 23, 2018

Related U.S. Application Data

(63) Continuation of application No. 15/392,491, filed on Dec. 28, 2016, now Pat. No. 9,985,650.

(30) Foreign Application Priority Data

May 4, 2016 (IN) .............................. 201641015445

(51) Int. Cl.
*H03M 7/00* (2006.01)
*H03M 7/30* (2006.01)
(Continued)

(52) U.S. Cl.
CPC .......... *H03M 7/6047* (2013.01); *H03D 7/165* (2013.01); *H03H 17/0664* (2013.01); *H03M 7/3059* (2013.01); *H03D 2200/0056* (2013.01)

(58) Field of Classification Search
CPC .... H04B 1/001; H04B 1/0017; H04B 1/0021; H04B 1/0025; H04B 1/707; H04L 1/0045;
(Continued)

(56) References Cited

U.S. PATENT DOCUMENTS 5,638,362 A * 6/1997 Dohi .................... H04B 7/2125
370/342
5,881,107 A 3/1999 Termerinac et al.
(Continued)

OTHER PUBLICATIONS

U.S. Appl. No. 15/392,491, filed Dec. 28, 2016 by Tangudu et al.*

*Primary Examiner* — Linh V Nguyen
(74) *Attorney, Agent, or Firm* — Ray A. King; Charles A. Brill; Frank D. Cimino

(57) ABSTRACT

A digital down converter includes a low resolution mixer, a decimation filter, and a high resolution mixer. The low resolution mixer is configured to receive a digitized radio frequency signal, and apply a first down conversion to the radio frequency signal to produce an intermediate frequency signal. The decimation filter is coupled to the low resolution mixer. The decimation filter is configured to receive the intermediate frequency signal, and reduce a sampling rate of the intermediate frequency signal to produce a decimated intermediate frequency signal. The high resolution mixer is coupled to the decimation filter. The high resolution mixer is configured to receive the decimated intermediate frequency signal, and apply a second down conversion to the decimated intermediate frequency signal to produce a down converted signal.

5 Claims, 3 Drawing Sheets

(51) Int. Cl.
*H03H 17/06* (2006.01)
*H03D 7/16* (2006.01)

(58) Field of Classification Search
CPC . H04L 5/143; H04L 2027/0057; H04L 27/34; H04L 5/023; H04L 25/03006; H04L 27/3863; H04L 5/06; H03M 3/458; H03M 3/496; H03M 3/344; H03M 3/498
USPC .......................................... 341/61, 141, 142
See application file for complete search history.

(56) References Cited

U.S. PATENT DOCUMENTS

| | | | | |
|---|---|---|---|---|
| 5,909,193 | A * | 6/1999 | Phillips | H04B 1/16 342/410 |
| 5,999,561 | A * | 12/1999 | Naden | H04B 1/707 375/142 |
| 7,386,061 | B1 | 6/2008 | Merriam, Jr. | |
| 8,817,913 | B2 * | 8/2014 | Hinson | H03H 17/0283 375/316 |
| 2002/0048325 | A1 | 4/2002 | Takahiko | |
| 2002/0048625 | A1 * | 4/2002 | Lachnit | A21C 11/12 426/512 |
| 2003/0207674 | A1 * | 11/2003 | Hughes | H03G 3/3068 455/234.1 |
| 2004/0029550 | A1 | 2/2004 | Kishi | |
| 2005/0280564 | A1 * | 12/2005 | Lee | H03H 17/0671 341/61 |
| 2008/0130809 | A1 * | 6/2008 | Kong | H04B 1/7085 375/355 |
| 2010/0011043 | A1 * | 1/2010 | Pu | G06F 17/142 708/404 |
| 2010/0150270 | A1 | 6/2010 | Furuta et al. | |
| 2012/0310601 | A1 * | 12/2012 | Martin | G01R 13/0272 702/190 |
| 2014/0119411 | A1 * | 5/2014 | Kummetz | H04B 7/15585 375/211 |
| 2014/0194081 | A1 | 7/2014 | Tohidian | H04B 1/0007 455/258 |
| 2015/0054566 | A1 * | 2/2015 | Bordow | H03M 1/12 327/336 |
| 2016/0087710 | A1 * | 3/2016 | Kummetz | H04B 7/15585 375/214 |

* cited by examiner

| (cos, sin) | $f_s/16$ | $2f_s/16$ | $3f_s/16$ | $4f_s/16$ | REQUIRED CSD MULTIPLIERS |
|---|---|---|---|---|---|
| STREAM 0 | (1, 0) | (1, 0) | (1, 0) | (1, 0) | {1, 0} |
| STREAM 1 | $(c_1, c_3)$ | $(c_2, c_2)$ | $(c_3, c_1)$ | (0, 1) | $\pm\{1, c_1, c_2, c_3, 0\}$ |
| STREAM 2 | $(c_2, c_2)$ | (0, 1) | $(-c_2, c_2)$ | (-1, 0) | $\pm\{1, c_2, 0\}$ |
| STREAM 3 | $(c_3, c_1)$ | $(-c_2, c_2)$ | $(-c_1, -c_3)$ | (0, -1) | $\pm\{1, c_1, c_2, c_3, 0\}$ |
| STREAM 4 | (0, 1) | (-1, 0) | (0, -1) | (1, 0) | $\pm\{1, 0\}$ |
| STREAM 5 | $(-c_3, c_1)$ | $(-c_2, -c_2)$ | $(c_1, -c_3)$ | (0, 1) | $\pm\{1, c_1, c_2, c_3, 0\}$ |
| STREAM 6 | $(-c_2, c_2)$ | (0, -1) | $(c_2, c_2)$ | (-1, 0) | $\pm\{1, c_2, 0\}$ |
| STREAM 7 | $(-c_1, c_3)$ | $(c_2, -c_2)$ | $(-c_3, c_1)$ | (0, -1) | $\pm\{1, c_1, c_2, c_3, 0\}$ |

DIGITAL DOWN CONVERTER

CROSS-REFERENCE TO RELATED APPLICATIONS

This continuation application claims priority to U.S. patent application Ser. No. 15/392,491, filed Dec. 28, 2016, which application claims priority to Indian Provisional Patent Application No. 201641015445, filed May 4, 2016, both of which are hereby incorporated herein by reference in their entirety.

BACKGROUND

In wireless receivers, down converters transform a radio frequency (RF) signal into a baseband signal centered at the zero frequency. Down conversion has traditionally been performed in the analog domain. However, the next generation of wireless base station receivers may employ RF sampling, in which the RF signal is directly sampled with a high speed, high performance analog to digital converter (ADC) (e.g., a 14 bit, 3 giga-sample-per-second ADC). The use of RF sampling allows such receivers to avoid mixers in the RF/analog domain, and to provide simultaneous multi-band reception by employing digital down-converters (DDC) for each of multiple bands using a single RF/analog receiver chain.

SUMMARY

A multi-band digital down converter having reduced circuit area and power consumption is disclosed herein. In one embodiment, a digital down converter includes a low resolution mixer, a decimation filter, a high resolution mixer, and frequency partitioning circuitry. The low resolution mixer is configured to receive a digitized radio frequency signal, and apply a first down conversion to the radio frequency signal to produce an intermediate frequency signal. The decimation filter is coupled to the low resolution mixer. The decimation filter is configured to receive the intermediate frequency signal, and reduce a sampling rate of the intermediate frequency signal to produce a decimated intermediate frequency signal. The high resolution mixer is coupled to the decimation filter. The high resolution mixer is configured to receive the decimated intermediate frequency signal, and apply a second down conversion to the decimated intermediate frequency signal to produce a down converted signal. The frequency partitioning circuitry is configured to select a first frequency to mix with the radio frequency signal in the low resolution mixer, to select a second frequency to mix with the decimated intermediate frequency signal in the high resolution mixer, and to select the first frequency and the second frequency to position the down converted signal about a selected center frequency.

In another embodiment, a frequency mixer includes a low resolution mixer configured to receive a digitized radio frequency signal, and apply a first down conversion to the radio frequency signal to produce an intermediate frequency signal. The low resolution mixer includes a canonical signed digit vector multiplier comprising a plurality of canonical signed digit multipliers arranged in parallel to multiply each sample of the digitized radio frequency signal by a plurality of different multiplier values to produce a plurality of product values for each sample of the digitized radio frequency signal.

In a further embodiment, a multi band frequency down converter includes a shared low resolution mixer and a plurality of down conversion channels coupled to the shared low resolution mixer. The shared low resolution mixer is configured to receive a digitized radio frequency signal, and apply a first down conversion to the radio frequency signal to produce an intermediate frequency signal. Each of the down conversion channels includes a decimation filter, a high resolution mixer, and frequency partitioning circuitry. The decimation filter is coupled to the shared low resolution mixer. The decimation filter is configured to receive the intermediate frequency signal, and reduce a sampling rate of the intermediate frequency signal to produce a decimated intermediate frequency signal. The high resolution mixer is coupled to the decimation filter. The high resolution mixer is configured to receive the decimated intermediate frequency signal, and apply a second down conversion to the decimated intermediate frequency signal to produce a down converted signal. The frequency partitioning circuitry is configured to select a first frequency to mix with the radio frequency signal in the low resolution mixer, to select a second frequency to mix with the decimated intermediate frequency signal in the high resolution mixer, and to select the first frequency and the second frequency to position the down converted signal about a selected center frequency.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

While digital down converters (DDCs) advantageously alleviate the need for analog mixers, conventional DDCs are subject to a variety of disadvantages. Because the radio frequency (RF) analog-to-digital converter (ADC) that provides data to the DDC samples at giga-sample per second (GSPS) rates, the digital circuitry needed to implement down conversion at such rates in conventional DDCs is complex and consumes a significant amount of power. For example, in a conventional DDC, each digital mixer performs a Cos/Sin computation followed by 2 multiplication operations for each sample generated by the RF ADC. The complexity of Cos/Sin computation can be prohibitive due to the high precision requirement (e.g., >16 bit frequency resolution & >96 dBc spurious free dynamic range (SFDR)). Dual band operation doubles power consumption. Consequently, power consumption of a conventional digital mixer can be very high (e.g., 100s of milli-watts per channel).

A digital down converter employs a digital mixer to perform a frequency translation of the input signal by a programmed frequency. The digital mixer multiplies the input signal with a cosine and sine of the programmed frequency, thereby reducing the center frequency of the input signal by the programmed frequency. Hence, this operation is referred to as digital down-conversion.

Embodiments of the DDC of the present disclosure reduce both circuit complexity and power consumption. The DDCs disclosed herein employ two stages of digital mixing. The first mixing stage employs a low resolution mixer that operates at the sampling rate of the RF ADC. The second mixing stage employs a high resolution mixer that operates at a lower rate. Embodiments include a decimation filter between the low resolution mixer and the high resolution mixer.

Figure 1:
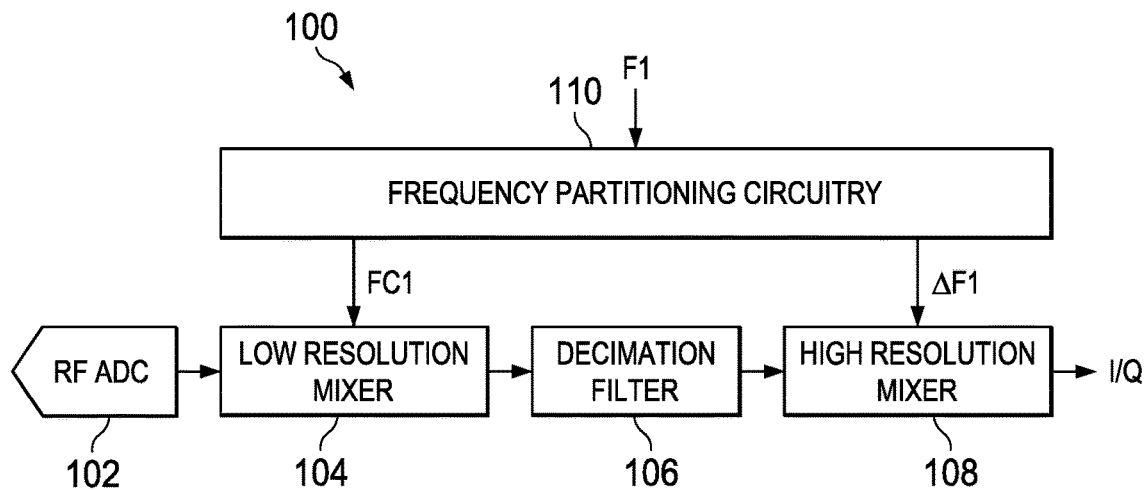
FIG. 1 shows a block diagram for a digital down converter (DDC) in accordance with various examples.

FIG. 1 shows a block diagram for a DDC 100 in accordance with various examples. The DDC 100 includes an RF ADC 102, a low resolution mixer 104, a decimation filter 106, a high resolution mixer 108, and frequency partitioning circuitry 110. The RF ADC 102 converts analog RF signals into digital samples at a high rate (e.g., 3 GSPS) and with high bit resolution (e.g., 14 bits). While embodiments of the DDC 100 are described herein in the context of RF signal digitization, embodiments are suitable for use in various applications in which digitized signals are to be shifted in frequency (e.g., where signals are digitized using an ADC operating at frequencies lower than RF). The rate of sampling provided by the RF ADC 102 is termed $f_s$. The low resolution mixer 104 is coupled to the RF ADC 102 and provides mixing at the sampling rate of the RF ADC at a relatively low frequency resolution to shift the RF frequency samples to an intermediate frequency. Some embodiments of the low resolution mixer 104 may provide a frequency resolution that is one-sixteenth of the sampling rate of the RF ADC 102. While the low resolution mixer 104 is illustrated as mixing in a single band, some embodiments of the low resolution mixer 104 can provide simultaneous multi-band mixing as will be further described herein.

The output of the low resolution mixer 104 is $$u_I(n)=x(n)\cos(2\pi FC_1 n), \text{ and}$$

$$u_Q(n)=-x(n)\sin(2\pi FC_1 n)$$

where:
$x(n)$ is the input signal to the low resolution mixer, at a sampling rate of $f_s$;
$FC_1$ is the normalized frequency value programmed into the low resolution mixer 104, with $FC_1$ being a ratio of the absolute frequency, e.g., in Hz, divided by the sampling rate $f_s$, e.g., in cycles/sec;
$u_I(n)$ is the in-phase (I) output signal of the low resolution mixer; and
$u_Q(n)$ is the quadrature (Q) output signal of the low resolution mixer.

The decimation filter 106 is coupled to the low resolution mixer 104. The decimation filter 106 reduces the bandwidth and the rate of samples received from the low resolution mixer 104. In some embodiments, the decimation filter 106 may include a plurality of sequential stages of decimation filtering. Because the desired signal at the output of the low resolution mixer 104 could be at a maximum frequency offset that is half the resolution of the low resolution mixer (for example, $f_s/32$) from DC, the bandwidth of the decimation filter 106 is increased to accommodate this maximum frequency offset.

The high resolution mixer 108 is coupled to the decimation filter 106. The output of the decimation filter 106, received by the high resolution mixer 108, is at a lower sampling rate than that processed by the low resolution filter 104. For example, the high resolution mixer 108 may operate at one quarter of the RF ADC sampling rate (i.e., $f_s/4$). The high resolution mixer 108 performs a cos/sin computation followed by a complex multiplication. The complex multiplier of the high resolution mixer 108 operates at the rate of the samples received from the decimation filter 106. Thus, the complex multiplier may operate at one quarter of the sampling rate provided by the RF ADC. As a result, sin/cos value generation in the high resolution mixer 108 may consume one quarter of the power of sin/cos generation in the mixer of a conventional DDC. The complex multiplier may be implemented using three real multipliers resulting in multiplier power consumption that is about 60% lower than the multiplier power consumption in a conventional DDC that operates at the RF ADC sampling rate (i.e., $f_s$).

The output of the high resolution mixer 108 is $$y_I(n)=v_I(n)\cos(2\pi\Delta F_1 n)+v_Q(n)\sin(2\pi\Delta F_1 n), \text{ and}$$

$$y_Q(n)=v_Q(n)\cos(2\pi\Delta F_1 n)-v_I(n)\sin(2\pi\Delta F_1 n)$$

where:
$v_I(n)$ is the in-phase (I) input signal to the high resolution mixer;
$v_Q(n)$ is the quadrature (Q) input signal to the high resolution mixer;
$\Delta F_1$ is the normalized center frequency value programmed into the high resolution mixer 108, with $\Delta F_1$ being a ratio of the absolute center frequency, e.g., in Hz, divided by the decimated sampling rate of the input signal provided to the high resolution mixer, e.g., at $f_s/4$ in cycles/sec;
$y_I(n)$ is the in-phase (I) output signal for the band; and
$y_Q(n)$ is the quadrature (Q) output signal for the band.

The frequency partitioning circuitry 110 partitions the selected center frequency $F_1$ between the low resolution mixer 104 and the high resolution mixer 108. In some embodiments, the frequency partitioning circuitry 110 partitions that selected center frequency $F_1$ between the low resolution mixer 104 and the high resolution mixer 108 as:

$$FC_1 = \frac{1}{M} * \text{round}\left(M * \frac{F_1}{f_s}\right), \text{ and}$$

$$\Delta F_1 = N * \left(\frac{F_1}{f_s} - FC_1\right),$$

where:

$F_1$ is the desired center frequency value, e.g., in Hz, and $f_s$ is the sampling rate of the input signal to the low resolution mixer, e.g., in cycles/sec;

$FC_1$ is the normalized frequency value programmed into the low resolution mixer 104 with an equivalent frequency resolution of $$\frac{f_s}{M},$$

e.g., M may be 16 in some embodiments;

$\Delta F_1$ is the normalized frequency value programmed into the high resolution mixer 108 that is operating at a sampling rate of $$\frac{f_s}{N},$$

e.g., N=4 for decimation by 4;

$$\frac{f_s}{M}$$

is the frequency resolution of the low resolution mixer 104; N is the decimation factor of the decimation filter 106; and round( ) is a function that rounds, for example, to the nearest integer.

Embodiments of the frequency partitioning circuitry 110 may be implemented using a processor (e.g., a general-purpose microprocessor, a microcontroller, etc.) and instructions that are executable by the processor to determine $FC_1$ and $\Delta F1$. In some embodiments, the frequency partitioning circuitry 110 may be implemented using dedicated hardware and/or a processor executing software programming. In various embodiments, the center frequencies for the low resolution mixer 104 and the high resolution mixer 108 may be configurable/programmable based on respective center frequency inputs for each of the mixers 104, 108. Each of the mixers 104, 108 may have a finite number of programmable center frequencies and the resolution of the mixer may refer to the interval between consecutive programmable center frequencies or how closely spaced consecutive programmable center frequencies are to each other. Mixers that have consecutive programmable center frequencies which are closer to each other or have a smaller interval between the frequencies may be said to have a higher frequency resolution. Likewise, mixers that have consecutive programmable center frequencies which are further from each other or have a greater interval between the frequencies may be said to have a lower frequency resolution. In some examples, mixer 104 may have a lower frequency resolution than mixer 108, and mixer 104 may have a higher sampling rate than mixer 108.

Figure 2:
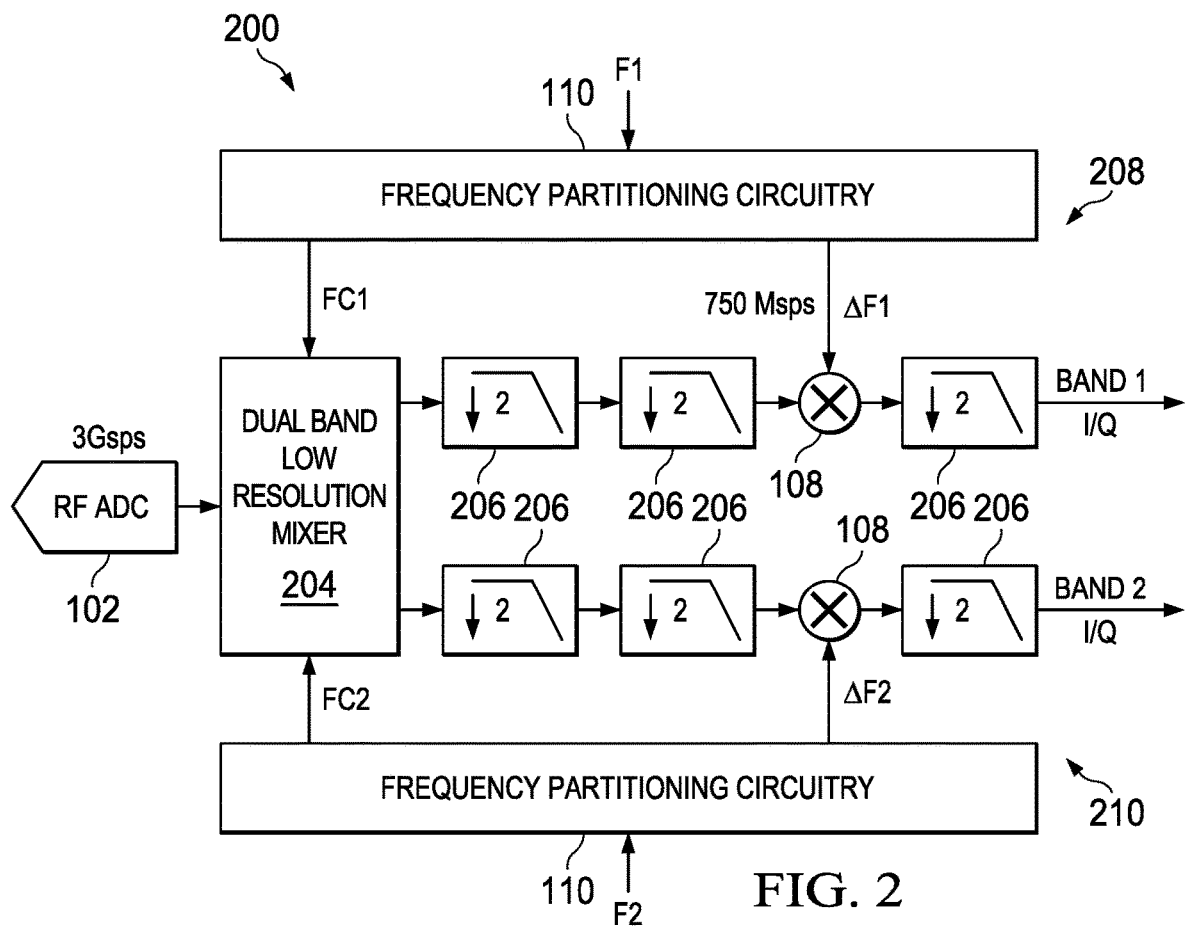
FIG. 2 shows a block diagram for a multi-band DDC in accordance with various examples.

FIG. 2 shows a block diagram for a multi-band DDC 200 in accordance with principles disclosed herein. The multi-band DDC 200 is similar to the DDC 100 of FIG. 1, but includes two down conversion channels 208 and 210, rather than the single down conversion channel of the DDC 100. Other embodiments of the DDC 200 may include any number of down conversion channels. The multi-band DDC 200 includes the RF ADC 102 and a shared multi-band low resolution mixer 204 that provides intermediate frequency samples to both down conversion channels 208 and 210. The shared low resolution mixer 204 is similar to the low resolution mixer 104, and includes circuitry to provide low resolution down conversion for two frequency bands. The intermediate frequency samples produced by the low resolution mixer 204 are provided to respective down conversion channel 208 and 210. By sharing circuitry of the low resolution mixer 204 with two down conversion channels 208 and 210, circuit area and power consumption can be reduced in embodiments of the multi-band DDC 200.

The down conversion channel 210 is identical to the down conversion channel 208. Each of the down conversion channels 208, 210 includes decimation filters 206, a high resolution mixer 108 and frequency partitioning circuitry 110. Each decimation filter 206 reduces the sampling rate by a factor of two. Accordingly, the sample rate received by the high resolution mixer 108 is one quarter of the sample rate provided by the RF ADC 102. The high resolution mixer 108 receives the decimated sample stream and mixes the frequency $\Delta F1$ or $\Delta F2$ with the decimated sample stream to produce a down converted sample stream. In some embodiments, a decimation filter 106 may further decimate the output of the high resolution mixer 108.

Each down conversion channel 208, 210 includes frequency partitioning circuitry 110 that partitions the selected center frequency F1 and F2 between the low resolution mixer 204 and the high resolution mixers 108 as described with respect to the DDC 100.

Figure 3:
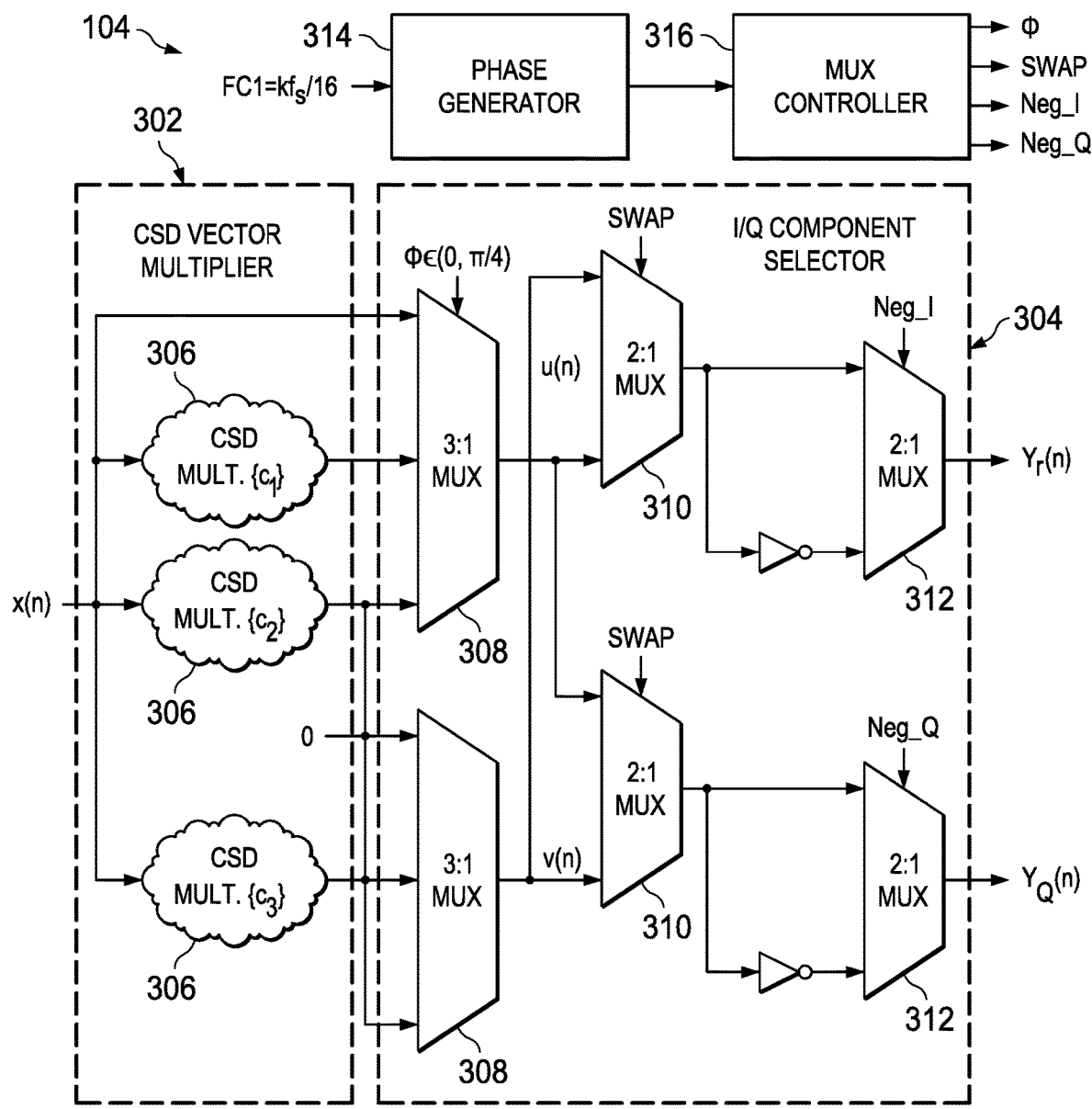
FIG. 3 shows a block diagram for a low resolution mixer suitable for use in a DDC in accordance with various examples.
Figure 4:
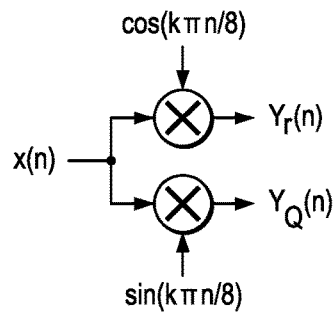
FIG. 4 depicts the low resolution mixer of FIG. 3 at a high level.

FIG. 3 shows a block diagram for an embodiment of the low resolution mixer 104. FIG. 4 depicts the low resolution mixer 104 at a higher level to facilitate understanding. The low resolution mixer 104 includes a canonical sign digit (CSD) vector multiplier 302, an I/Q component selector 304, a phase generator 314, and a MUX controller 316. The instantaneous phase of the cos/sin terms applied in the low resolution mixer 104 is multiples of $\pi/8$. The low resolution mixer 104 multiplies the real input samples x(n) provided by the RF ADC 102 with $\cos(nk\pi/8)$, where n is an integer value and represents the sequence index, and the programmed center frequency of the low resolution mixer 104 for a band is $FC1=kf_s/16$. Embodiments multiply each input sample with each of $\{1, c_1=\cos(\pi/8), c_2=\cos(\pi/4), c_3=\cos(3\pi/8),$ and $0\}$ and selectively apply a sign inversion to generate each output sample of in phase signal $y_I(n)$. The output samples of quadrature signal $y_Q(n)$ are generated analogously, but by multiplying with $\sin(nk\pi/8)$. The fixed nature of $\{c_1, c_2, c_3\}$ allow embodiments of the low resolution mixer 104 to replace a generic multiplier with CSD based adders. Accordingly, the CSD vector multiplier 302 includes a plurality of CSD multipliers 306. Each CSD multiplier 306 may include adders and shifters to provide multiplication of an input sample by a given cos/sin term. The CSD vector multiplier 302 provides, for each input sample, an output value for each cos/sin term.

Some embodiments of the CSD Vector Multiplier 302 may include gating circuitry to gate unused terms in the CSD vector multiplier 302. The gating circuitry reduces the power consumption of the CSD vector multiplier 302, on average, especially when the programmed frequency FC1 and FC2 does not require computation of all terms $x(n)*c_1$, $x(n)*c_2$, and $x(n)*c_3$.

The I/Q component selector 304 includes multiplexers 308, 310, and 312. The multiplexers 308, 310, and 312 select from the outputs of the CSD vector multiplier 302 to generate the in-phase and quadrature sample outputs. Multiplexers 308 select from the outputs of the CSD vector multiplier 302 in a range of 0 to $\pi/4$. The multiplexers 310 select from the outputs of the multiplexers 308. The multiplexers 312 select a negated or an unnegated version of the output of a corresponding multiplexer 310 to represent the in-phase or quadrature output sample.

The phase generator 314 computes the required phase $nk\pi/8$ corresponding to each input sample received by the low resolution mixer 104. The MUX controller 316 uses this phase value to generate the control signals ($\phi$, Swap, Neg_I, and Neg_Q) that control the multiplexers 308, 310, and 312. The control signal $\phi$ takes one of the three values for each phase 0, $\phi/8$, and $\phi/4$. The Swap signal is determined based on the phase value, i.e., whether mod(nk $\pi/8$, $\phi/2$) is in the range of [0, $\phi/4$], enabling reuse of the CSD multiplier outputs to generate both $y_I(n)$ and $y_Q(n)$. The signals Neg_I and Neg_Q respectively negate signals for the in-phase and quadrature sample outputs.

Figures 5, 6:
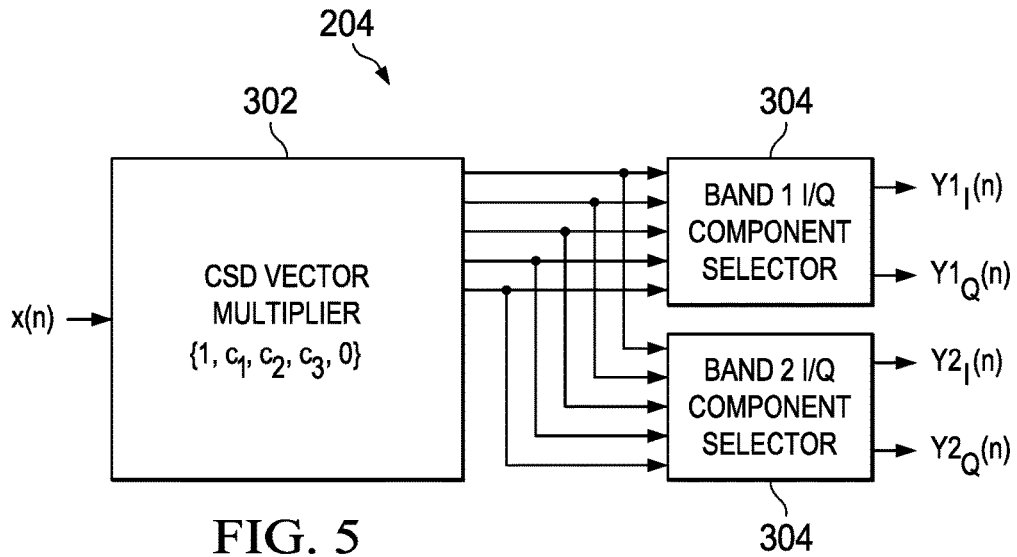
FIG. 5 shows a block diagram for a multi-band low resolution mixer suitable for use in a DDC in accordance with various examples.
FIG. 6 shows an example of coefficients to be supported by canonical signed digit multipliers implemented in each of eight parallel multipliers of a low resolution mixer that processes an RF signal as eight parallel streams in a DDC in accordance with various examples.

FIG. 5 shows a block diagram for an embodiment of the multi-band low resolution mixer 204. The multi-band low resolution mixer 204 is similar to the low resolution mixer 104 described with respect to FIG. 4. The multi-band low resolution mixer 204 includes a CSD vector multiplier 302 and includes an instance of the I/Q component selector 304 for each band to be down converted. The multi-band low resolution mixer 204 is a two band mixer and includes two instance of the I/Q component selector 304. Embodiments of the multi-band low resolution mixer 204 that support down conversion of a given number of bands include an instance of the I/Q component selector 304 for each of the given number of bands.

Each of the I/Q component selectors 304 is coupled to the CSD Vector Multiplier 302. Accordingly, a single CSD Vector Multiplier 302 provides all of the multiplication operations for any number of bands, and the I/Q component selector 304 for each band selects the outputs of the CSD Vector Multiplier 302 based on the $\phi$, Swap, Neg_I, and Neg_Q signals generated by the I/Q component selector 304 to produce the output samples for the band.

Using the multi-band low resolution mixer 204, the circuit area devoted to a dual-band low resolution mixer in a DDC may be about 13% of the mixer circuit area in a conventional dual-band down converter, and the area/power consumption of the mixers in the DDC 200 may be about 55% lower than that needed for the mixers of a conventional dual-band DDC.

Because the low resolution mixer 204 operates at the sampling rate of the RF ADC 102, which, for example, may be as high as 3 GSPS, some embodiments of the low resolution mixer 204 may be implemented to process a number of input samples (e.g., 4 or 8) in parallel at a lower clock rate (e.g., $f_s/4$ or $f_s/8$). For example, in an 8× parallelized implementation of the low resolution mixer 204 (e.g., by using a CLK=$f_s/8$), the CSD vector multiplier 302 and the I/Q component selector 304 can be simplified for some of the parallel streams, as processing for all streams may not need to support all of the terms $\{1, c_1, c_2, c_3, 0\}$, but rather may only need to support a subset of the total number of terms, e.g., $\{1, c_2, 0\}$ or $\{1, 0\}$.

FIG. 6 shows an example of the CSD multiplier scaling terms implemented in each of eight parallel CSD vector multipliers of a low resolution mixer 204 that processes samples of an RF signal as eight parallel streams in accordance with various examples. Streams 0 and 4 are multiplied by only zero or one, which requires no adder or shifter circuitry. Streams 2 and 6 and multiplied by zero, one and $c_2$. Streams 1, 3, 5, and 7 are multiplied by zero, one and $c_1$, $c_2$, and $c_3$. Accordingly, only half of the CSD vector multipliers 302 in the eight stream parallel implementation require multipliers for all the coefficients applied in the low resolution mixer 204, and the number of CSD multipliers in the remaining four CSD vector multipliers 302 can be reduced to save power and circuit area.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A frequency mixer, comprising:
   a low resolution mixer configured to:
      receive a digitized radio frequency signal; and
      apply a first down conversion to the radio frequency signal to produce an intermediate frequency signal;
   wherein the low resolution mixer comprises a canonical signed digit (CSD) vector multiplier comprising a plurality of CSD multipliers arranged in parallel to multiply each sample of the digitized radio frequency signal by a plurality of different multiplier values to produce a plurality of product values for each sample of the digitized radio frequency signal.

2. The frequency mixer of claim 1, wherein the CSD vector multiplier is configured to execute multiplication of the digitized radio frequency signal only with cosine values of phases ranging from 0 to $\pi/2$.

3. The frequency mixer of claim 1, wherein the low resolution mixer comprises an I/Q selector comprising a plurality of multiplexers coupled to outputs of the CSD vector multiplier and configured to select one of the product values to be a sample of the intermediate frequency signal.

4. The frequency mixer of claim 3, wherein the low resolution mixer comprises a phase generator configured to generate a phase value corresponding to each sample of the digitized radio frequency signal, the phase value based on a frequency to be mixed with the digitized radio frequency signal in the low resolution mixer.

5. The frequency mixer of claim 1, further comprising a plurality of additional CSD vector multipliers, wherein each sample of the digitized radio frequency signal is processed by only one of the CSD vector multipliers, and one or more of the additional CSD vector multipliers comprises fewer than a maximum number CSD multipliers needed to provide parallel multiplication of a sample of by the plurality of different multiplier values applied in the low resolution mixer.

* * * * *